United States Patent
Jia (10) Patent No.: US 10,297,615 B2
(45) Date of Patent: May 21, 2019

(54) DISPLAY PANEL, DISPLAY DEVICE AND DRIVING METHOD THEREOF

(71) Applicant: BOE Technology Group Co., Ltd., Beijing (CN)

(72) Inventor: Yu'e Jia, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/647,395

(22) Filed: Jul. 12, 2017

(65) Prior Publication Data

US 2018/0059496 A1    Mar. 1, 2018

(30) Foreign Application Priority Data

Aug. 25, 2016   (CN) .......................... 2016 1 0728986

(51) Int. Cl.
*H01L 27/12*    (2006.01)
*G02F 1/135*    (2006.01)
(Continued)

(52) U.S. Cl.
CPC .......... *H01L 27/1214* (2013.01); *G02F 1/135* (2013.01); *G02F 1/136* (2013.01);
(Continued)

(58) Field of Classification Search
CPC ............... H01L 27/1214; H01L 27/124; H01L 27/3232; G09G 3/36; G09G 3/3611;
(Continued)

(56) References Cited

U.S. PATENT DOCUMENTS 7,834,971 B2    11/2010   Chen et al.
9,348,181 B2 *   5/2016   Kim .................. G02F 1/133753
(Continued)

FOREIGN PATENT DOCUMENTS

CN    101315504 A    12/2008
CN    101315507 A    12/2008
(Continued)

OTHER PUBLICATIONS

First Office Action, including Search Report, for Chinese Patent Application No. 201610728986.3, dated Oct. 31, 2018, 20 pages.

*Primary Examiner* — Eduardo A Rodela
(74) *Attorney, Agent, or Firm* — Westman, Champlin & Koehler, P.A.

(57) ABSTRACT

The present disclosure discloses a display panel, a display device and a driving method thereof. The display panel comprises: a first substrate and a second substrate arranged opposite to each other, and liquid crystals disposed between the first substrate and the second substrate, the first substrate comprising a plurality of gate lines and a plurality of data lines, wherein the first substrate is provided with a plurality of pixel regions distributed in an array, each of the plurality of pixel regions being provided with liquid crystals having four initial pretilt angles and comprising a first sub-pixel region and a second sub-pixel region arranged in a scanning direction, each of the first sub-pixel region and the second sub-pixel region being provided with one thin film transistor; each of the plurality of gate lines is connected to gates of all the thin film transistors in a row of pixel regions, each of the plurality of data lines being connected to a first electrode of all the thin film transistors in a column of pixel regions, the first electrode being one of a source and a drain; and the display panel further comprises a driving circuit for
(Continued)

providing different gate turn-on voltages to two adjacent gate lines.

20 Claims, 4 Drawing Sheets

(51) Int. Cl.
  *H01L 27/32* (2006.01)
  *G09G 3/36* (2006.01)
  *G02F 1/136* (2006.01)
  *G02F 1/1362* (2006.01)
  *H01L 51/05* (2006.01)
  *H01L 51/52* (2006.01)
  *G02F 1/1337* (2006.01)
  *G02F 1/1343* (2006.01)

(52) U.S. Cl.
  CPC ......... *G02F 1/136286* (2013.01); *G09G 3/36* (2013.01); *G09G 3/3637* (2013.01); *G09G 3/3685* (2013.01); *G09G 3/3696* (2013.01); *H01L 27/124* (2013.01); *H01L 27/3232* (2013.01); *H01L 51/0529* (2013.01); *G02F 2001/133757* (2013.01); *G02F 2001/134345* (2013.01); *G09G 2310/0251* (2013.01); *H01L 51/5203* (2013.01)

(58) Field of Classification Search
  CPC .. G09G 3/3614; G09G 3/3685; G09G 3/3695; G09G 3/3696; G02F 1/33371; G02F 1/33707; G02F 1/33753; G02F 1/33788; G02F 1/135; G02F 1/136; G02F 1/136286
  See application file for complete search history.

(56) References Cited

U.S. PATENT DOCUMENTS

| | | | |
|---|---|---|---|
| 2002/0008688 A1* | 1/2002 | Yamamoto | G09G 3/3648 345/98 |
| 2002/0080320 A1* | 6/2002 | Suzuki | G02F 1/133707 349/153 |
| 2006/0050209 A1* | 3/2006 | Higa | G02F 1/133371 349/114 |
| 2007/0120801 A1* | 5/2007 | Ho | G09G 3/3666 345/98 |
| 2008/0284960 A1* | 11/2008 | Sohn | G02F 1/133788 349/128 |
| 2009/0066619 A1 | 3/2009 | Chen | |
| 2011/0085097 A1* | 4/2011 | Lee | G02F 1/133788 349/33 |
| 2011/0128487 A1* | 6/2011 | Kim | G02F 1/133753 349/123 |
| 2011/0242468 A1* | 10/2011 | Choi | C08G 8/12 349/129 |
| 2014/0043571 A1 | 2/2014 | Chang et al. | |
| 2014/0306947 A1* | 10/2014 | Miyamoto | H03K 17/162 345/212 |

FOREIGN PATENT DOCUMENTS

| | | |
|---|---|---|
| CN | 101382710 A | 3/2009 |
| CN | 101398581 A | 4/2009 |

* cited by examiner

DISPLAY PANEL, DISPLAY DEVICE AND DRIVING METHOD THEREOF

CROSS-REFERENCE TO RELATED APPLICATION(S)

This application claims priority to Chinese Application No. 201610728986.3, filed on Aug. 25, 2016, entitled "Display Panel, Display Device and Driving Method Thereof", which is incorporated herein by reference in its entirety.

TECHNICAL FIELD

The present disclosure relates to the field of displays, and more particularly, to a display panel, a display device and a driving method thereof.

BACKGROUND

With increasing maturity of liquid crystal display technology, performance requirements for a Liquid Crystal Display (LCD) panel on the market develop towards such as high contrast, high brightness, low color shift, wide viewing angle and the like. Currently, there are three main technologies that can meet the wide viewing angle requirement, i.e., a LCD panel with Twist Nematic (TN) and a wide viewing angle film, an In Plane Switch (IPS) LCD panel, and a Multi-domain Vertical Alignment (MVA) LCD panel. The MVA LCD panel controls liquid crystals in vertical alignment to deflect to a plurality of different angles (initial pretilt angles), such as two angles, four angles, etc., when the liquid crystals are in a still state, so as to enable the display panel to achieve a dual-domain mode or a four-domain mode when the display panel is powered on. A LCD panel in an eight-domain mode divides each pixel into two sub-pixels on a basis of four-domain mode, and obtains different liquid crystal deflection voltages by controlling the two sub-pixels, so that deflection angles of the liquid crystals corresponding to the two sub-pixels are different, thereby obtaining the LCD panel in the eight-domain mode.

For an existing LCD panel in the eight-domain mode, it is required to control the two sub-pixels to obtain different liquid crystal deflection voltages. Therefore, it is necessary to control the liquid crystal deflection voltages of the two sub-pixels respectively by two driving lines (e.g., two gate lines), which results in a complex design for a driving circuit.

SUMMARY

In order to at least partly solve the problem of the complex design for the driving circuit of the existing LCD panel in the eight-domain mode, embodiments of the present disclosure provide a display panel, a display device and a driving method thereof as follows.

In a first aspect, an embodiment of the present disclosure provides a display panel, comprising: a first substrate and a second substrate arranged opposite to each other, and liquid crystals disposed between the first substrate and the second substrate, the first substrate comprising a plurality of gate lines and a plurality of data lines, wherein the first substrate is provided with a plurality of pixel regions distributed in an array, each of the plurality of pixel regions being provided with liquid crystals having four initial pretilt angles and comprising a first sub-pixel region and a second sub-pixel region arranged in a scanning direction, and each of the first sub-pixel region and the second sub-pixel region being provided with one thin film transistor;

each of the plurality of gate lines is connected to gates of all the thin film transistors in a row of pixel regions, each of the plurality of data lines being connected to first electrodes of all the thin film transistors in a column of pixel regions, and the first electrode being one of a source and a drain; and the display panel further comprises a driving circuit for providing different gate turn-on voltages to two adjacent gate lines.

In an implementation of the embodiment of the present disclosure, the driving circuit is operative to provide a first gate turn-on voltage to the gate lines connected to odd-numbered rows of pixel regions, and to provide a second gate turn-on voltage to the gate lines connected to even-numbered rows of pixel regions.

In another implementation of the embodiment of the present disclosure, a difference between the first gate turn-on voltage and the second gate turn-on voltage is in a preset range.

In another implementation of the embodiment of the present disclosure, when the first gate turn-on voltage and the second gate turn-on voltage are provided to the plurality of gate lines respectively, a charging rate of pixel electrodes in each of the first sub-pixel regions and each of the second sub-pixel regions is greater than a preset value, the pixel electrode being connected to a second electrode of the thin film transistor, and the second electrode being an electrode in the source and the drain other than the first electrode.

In another implementation of the embodiment of the present disclosure, the preset value is 98.5%.

In another implementation of the embodiment of the present disclosure, the gate line is arranged between the first sub-pixel region and the second sub-pixel region.

In a second aspect, an embodiment of the present disclosure further provides a display device, comprising the display panel according to any implementations of the first aspect.

In a third aspect, an embodiment of the present disclosure further provides a method of driving a display panel, comprising:

providing gate turn-on voltages to respective ones of a plurality of gate lines sequentially in a scanning direction, the gate turn-on voltages provided to adjacent gate lines being different; and providing a data signal to respective ones of a plurality of data lines.

In an implementation of the embodiment of the present disclosure, providing the gate turn-on voltages to respective ones of the plurality of gate lines sequentially in the scanning direction comprises:

providing a first gate turn-on voltage to the gate lines connected to odd-numbered rows of pixel regions, and providing a second gate turn-on voltage to the gate lines connected to even-numbered rows of pixel regions.

In another implementation of the embodiment of the present disclosure, a difference between the first gate turn-on voltage and the second gate turn-on voltage is in a preset range.

In another implementation of the embodiment of the present disclosure, when the first gate turn-on voltage and the second gate turn-on voltage are provided to the plurality of gate lines respectively, a charging rate of pixel electrodes in each of the first sub-pixel regions and each of the second sub-pixel regions is greater than a preset value, the pixel electrode being connected to a second electrode of the thin film transistor, and the second electrode being an electrode in the source and the drain other than the first electrode.

In another implementation of the embodiment of the present disclosure, the preset value is 98.5%.

BRIEF DESCRIPTION OF THE DRAWINGS

In order to illustrate the technical solutions in the embodiments of the present disclosure more clearly, the drawings, which are intended to be used in the description of the embodiments, will be briefly described hereinafter. It will be apparent that the drawings in the following description are merely examples of the present disclosure, other drawings may be obtained by the skilled in the art based on these drawings without creative labor.

DETAILED DESCRIPTION

In order to clarify purposes, technical solutions and advantages of the present disclosure, the embodiments of the present disclosure will be further described below in detail with reference to the drawings.

Figure 1A:
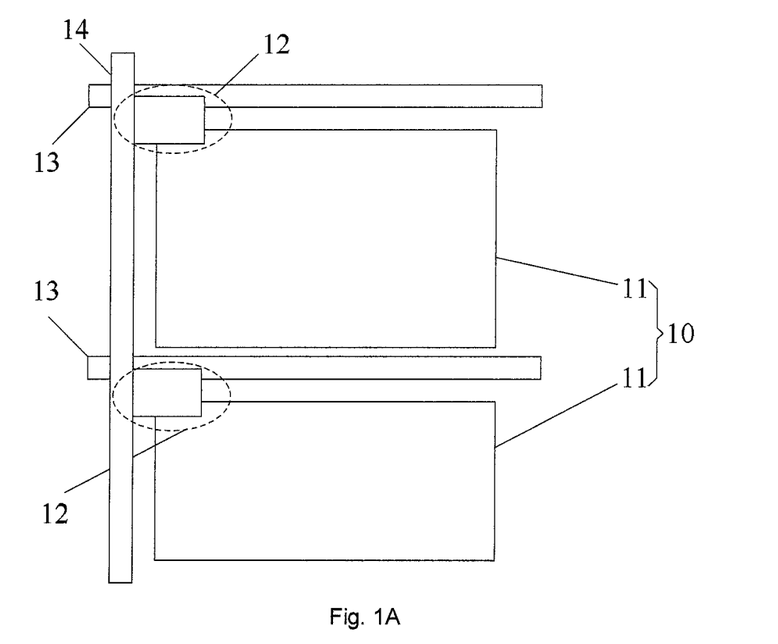
FIG. 1A is a schematic diagram of a structure of an array substrate of a conventional eight-domain LCD panel.

FIG. 1A is a schematic diagram of a structure of an array substrate of a conventional eight-domain LCD panel. With reference to FIG. 1A, each pixel region 10 comprises two sub-pixel regions 11, each of the sub-pixel regions 11 comprising a thin film transistor 12, each thin film transistor 12 being connected to a gate line 13, and two thin film transistors 12 being commonly connected to a data line 14.

Each pixel region in the present disclosure corresponds to a color optical filter, which emits one color, on a color film substrate.

Each of the pixel regions 10 is provided with liquid crystals having four initial pretilt angles. Then, by providing different gate turn-on voltages to the two gate lines 13, pixel voltages which are output to pixel electrodes of the two sub-pixel regions 11 by the two thin film transistors 12 are different, so that there are liquid crystals having eight deflection angles in each pixel region 10, thereby achieving eight-domain display.

Figure 1B:
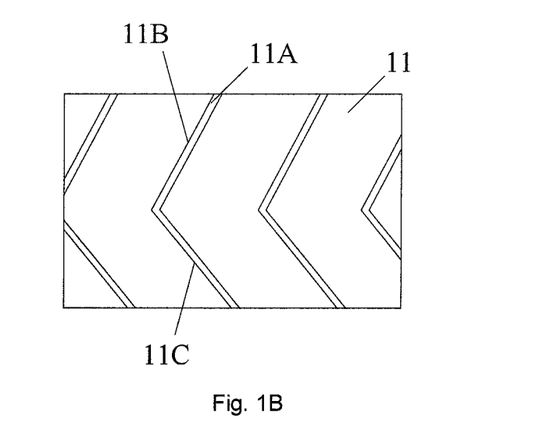
FIG. 1B is a schematic diagram of a structure of a sub-pixel region in a conventional eight-domain LCD panel.
Figure 1C:
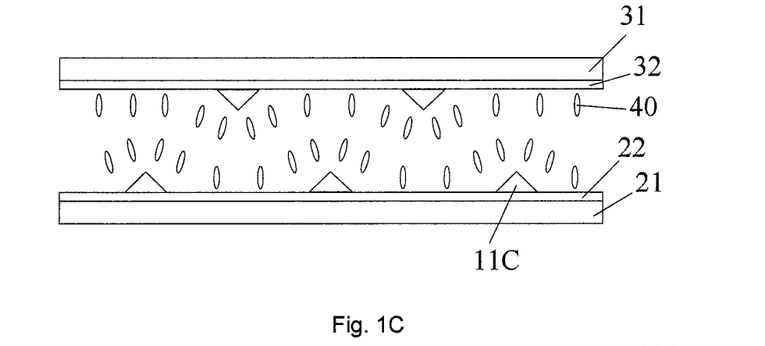
FIG. 1C is a schematic diagram of a structure of a conventional eight-domain LCD panel.

There may be various approaches for achieving the liquid crystals having four initial pretilt angles in the pixel region 10. For example, as shown in FIG. 1B, projections 11A are arranged in the sub-pixel region 11. The projection 11A is designed to be a fold line, and includes a first straight line portion 11B and a second straight line portion 11C which are connected angularly. As shown in FIG. 1C, the second straight line portions 11C of the projections are arranged on the pixel electrode 22 on the first substrate 21 and a common electrode 32 on the second substrate 31, respectively. The first substrate 21 and the second substrate 31 are arranged opposite to each other, and the liquid crystals 40 are disposed between the first substrate 21 and the second substrate 31.

As shown in FIG. 1C, the liquid crystals 40 form two initial pretilt angles by the second straight line portion 11C of the projection; accordingly, the liquid crystals 40 may also form two initial pretilt angles by the first straight line portion 11B of the projection. Thus, the four initial pretilt angles are obtained.

Although the conventional eight-domain LCD panel as shown in FIG. 1A can form the eight-domain display, it is required to design two gate lines for each row of pixel regions, which results in a complicated design for the driving circuit.

Figure 2A:
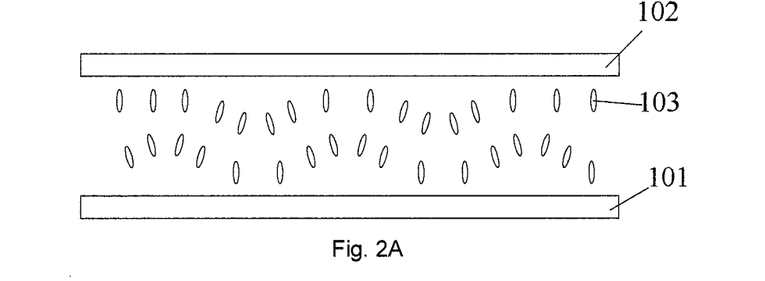
FIG. 2A is a schematic diagram of a structure of a display panel provided according to an embodiment of the present disclosure.

FIG. 2A is a schematic diagram of a structure of a display panel provided according to an embodiment of the present disclosure. With reference to FIG. 2A, the display panel comprises a first substrate 101 and a second substrate 102 arranged opposite to each other, and liquid crystals 103 disposed between the first substrate 101 and the second substrate 102. In the embodiment of the present disclosure, the first substrate 101 is an array substrate, and the second substrate 102 is a color film substrate.

Figure 2B:
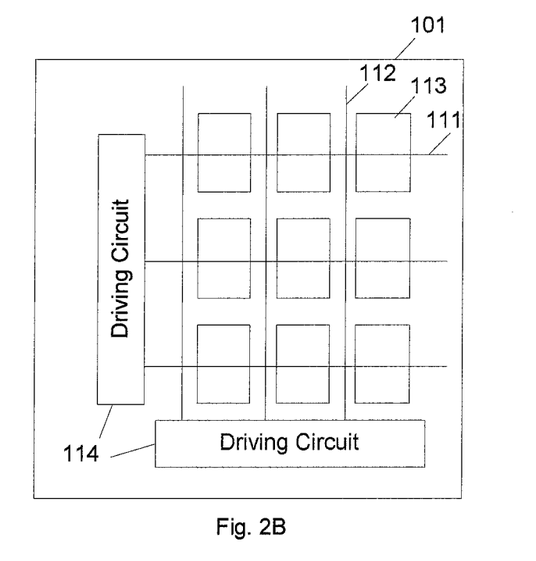
FIG. 2B is a schematic diagram of a structure of a first substrate provided according to an embodiment of the present disclosure.

FIG. 2B is a schematic diagram of a structure of a first substrate provided according to an embodiment of the present disclosure. With reference to FIG. 2B, the first substrate 101 comprises a plurality of gate lines 111 and a plurality of data lines 112. The plurality of gate lines 111 are arranged in parallel with each other, and the plurality of data lines 112 are arranged in parallel with each other, the gate lines 111 and the data lines 112 being perpendicular to each other.

The first substrate 101 is provided with a plurality of pixel regions 113 which are distributed in an array, each of the plurality of pixel regions 113 being provided with liquid crystals having four initial pretilt angles (not shown).

Figure 2C:
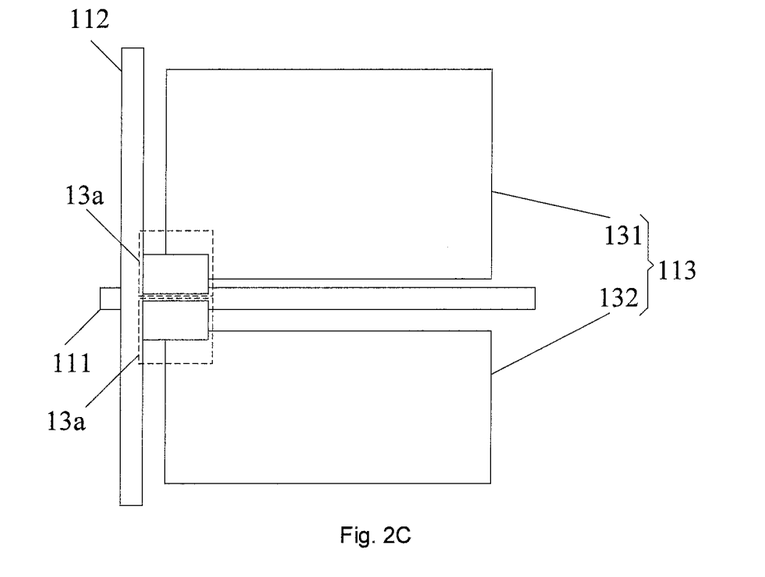
FIG. 2C is a schematic diagram of a structure of a pixel region provided according to an embodiment of the present disclosure.

FIG. 2C is a schematic diagram of a structure of a pixel region provided according to an embodiment of the present disclosure. With reference to FIG. 2C, each pixel region 113 comprises a first sub-pixel region 131 and a second sub-pixel region 132 arranged in a scanning direction, each of the first sub-pixel region 131 and the second sub-pixel region 132 being provided with a thin film transistor 13a.

Figure 2D:
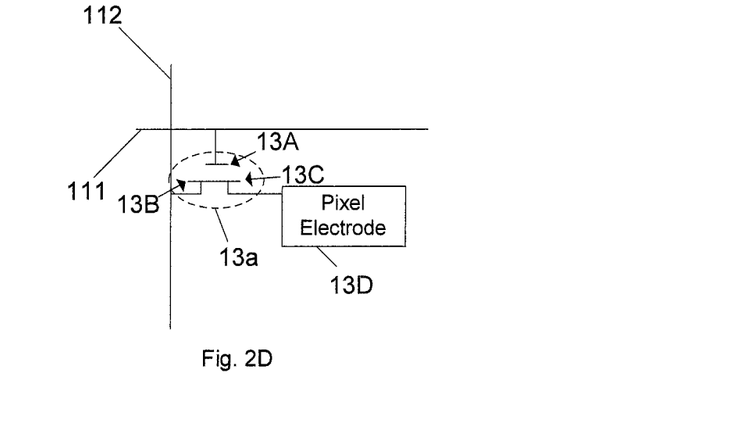
FIG. 2D is a schematic diagram of a structure of a thin film transistor provided according to an embodiment of the present disclosure.

FIG. 2D is a schematic diagram of a structure of a thin film transistor provided according to an embodiment of the present disclosure. With reference to FIG. 2D, the thin film transistor 13a comprises a gate 13A, a source 13B and a drain 13C, each of a plurality of gate lines 111 being connected to the gates 13A of all the thin film transistors 13a in a row of pixel regions 113, each of the plurality of data lines 112 being connected to the sources 13B of all the thin film transistors 13a in a column of pixel regions 113, and the drain 13C of the thin film transistor 13a being connected to a pixel electrode 13D. A pixel electrode 13D is respectively arranged on the first sub-pixel region 131 and the second sub-pixel region 132. Of course in the present embodiment, the source and the drain of the thin film transistor are interchangeable when different types of thin film transistors are used. Thus in another embodiment, each of the plurality of data lines 112 is connected to the drains 13C of all the thin film transistors 13a in the pixel region 113, and the sources 13B of the thin film transistor 13a is connected to the pixel electrode 13D.

Turn back to FIG. 2B, the display panel further comprises a driving circuit 114 for providing different gate turn-on voltages to two adjacent gate lines 112.

In the embodiment of the present disclosure, each pixel region is divided into two sub-pixel regions which are distributed in the scanning direction, one gate line drives the thin film transistors in two rows of sub-pixel regions in one row of pixel regions simultaneously, and one data line supplies a data signal to the thin film transistors in two sub-pixel regions of the same pixel region, so that the liquid crystal deflection voltages of two sub-pixel regions of the same pixel region are identical, but the liquid crystal deflection voltages of two adjacent rows of pixel regions are different since the gate turn-on voltages of the two adjacent rows of pixel regions are different. At this time, assuming that two adjacent rows of sub-pixel regions in four rows of sub-pixel regions in two rows are regarded as one row of pixel regions, the liquid crystal deflection voltages of two rows of sub-pixel regions in such row of pixel regions are different. Since two rows of sub-pixel regions of such row of pixel regions are respectively provided with liquid crystals having four initial pretilt angles, i.e., each row of sub-pixel region may form a four-domain mode, the pixel regions as previously discussed may form an eight-domain mode. The display panel controls one row of pixel regions by only one gate line to form the eight-domain mode, thus the design of the driving circuit is simple.

In an implementation, in order to achieve the liquid crystals having four initial pretilt angles in the pixel region 10, projections 11A may be arranged in the sub-pixel region 11 in a way as shown in FIG. 1B, details of which may refer to the previous description, and thus will be omitted here for simplicity.

In an implementation, the driving circuit 114 may be implemented using an integrated circuit. The driving circuit comprises a gate line driving unit for outputting a gate voltage (including the gate turn-on voltage) to the gate line 111 and a data line driving unit for outputting a data signal to the data line 112.

In the embodiment of the present disclosure, there may be various ways for the driving circuit 114 to output the gate turn-on voltages to the plurality of gate lines 111, so that different gate turn-on voltages are provided to the two adjacent gate lines 11. For example, a gate turn-on voltage which is varied gradually is output to the respective gate lines 111 in the scanning direction, or \ gate turn-on voltages which are varied alternately are output to the respective gate lines 111 in the scanning direction.

Preferably, the driving circuit 114 is operative to provide a first gate turn-on voltage to the gate line 111 connected to the odd-numbered rows of pixel regions 113, and provide a second gate turn-on voltage to the gate line 111 connected to the even-numbered rows of pixel regions 113, the first gate turn-on voltage and the second gate turn-on voltage being different. In this implementation, using only two voltages for alternately driving the respective rows of pixel regions 113 leads to a simplest driving signal design.

The driving circuit 114 may be arranged on the first substrate 101, e.g., in a peripheral area of the first substrate 101. The peripheral area is an area which is peripheral to the display area, and the display area is an area provided with a thin film transistor array.

In particular, a difference between the first gate turn-on voltage and the second gate turn-on voltage may be in a preset range. A too large difference between the first gate turn-on voltage and the second gate turn-on voltage may affect normal display, while a too small difference between the first gate turn-on voltage and the second gate turn-on voltage cannot form the eight-domain mode. Generally, the preset range may be 10%-30% of the first gate turn-on voltage. For example, the difference between the first gate turn-on voltage and the second gate turn-on voltage in a table below is 20% of the first gate turn-on voltage.

In the embodiment of the present disclosure, the first gate turn-on voltage and the second gate turn-on voltage also need to satisfy the requirement on a charging rate. Specifically, when the first gate turn-on voltage and the second gate turn-on voltage are respectively provided to the plurality of gate lines 111, the charging rate of the pixel electrodes in each of the first sub-pixel regions 131 and each of the second sub-pixel regions 132 is greater than a preset value. As shown in FIG. 2D, the pixel electrode 13D is connected to the drain 13C of the thin film transistor 13a. The charging rate is a ratio of an actual voltage of the pixel electrode to a target voltage of the pixel electrode. By controlling the two gate turn-on voltages to ensure that the charging rate satisfies the requirement, the display panel may display normally.

In the display panel in the eight-domain mode, the preset value is generally specified as 98.5%.

The table below provides correspondence among a gate turn-on voltage, a charging rate and a pixel voltage.

| | Gate Turn-On Voltage (V) | Charging Rate CR (%) | Pixel Voltage Vp (V) |
|---|---|---|---|
| N-th Row Of First Sub-Pixel Region | 20 | 99.99 | 14.00 |
| N-Th Row Of Second Sub-Pixel Region | 20 | 99.99 | 14.00 |
| (N + 1)-Th Row Of First Sub-Pixel Region | 16 | 99.49 | 13.93 |
| (N + 1)-Th Row Of Second Sub-Pixel Region | 16 | 98.94 | 13.85 |

With reference to FIG. 2C, in the embodiment of the present disclosure, the gate line 111 is arranged between the first sub-pixel region 131 and the second sub-pixel region 132. The gate line being designed to be arranged between the first sub-pixel region and the second sub-pixel region facilitates wiring of the gate line.

An embodiment of the present disclosure further provides a display device comprising the display panel as shown in FIG. 2A.

In a particular implementation, the display device provided by the embodiment of the present disclosure may be any product or component having a display function, such as a mobile phone, a tablet, a TV, a display, a notebook, a digital photo frame, a navigator, and the like.

In the embodiment of the present disclosure, each pixel region is divided into two sub-pixel regions which are distributed in the scanning direction, one gate line drives the thin film transistors in two rows of sub-pixel regions in one row of pixel regions simultaneously, and one data line supplies a data signal to the thin film transistors in two sub-pixel regions of the same pixel region, so that the liquid crystal deflection voltages of two sub-pixel regions of the same pixel region are identical, but the liquid crystal deflection voltages of two adjacent rows of pixel regions are different since the gate turn-on voltages of the two adjacent rows of pixel regions are different. At this time, assuming that two adjacent rows of sub-pixel regions in four rows of sub-pixel regions in two rows are regarded as one row of pixel regions, the liquid crystal deflection voltages of two rows of sub-pixel regions in such row of pixel regions are different. Since two rows of sub-pixel regions of such row of pixel regions are respectively provided with liquid crystals having four initial pretilt angles, i.e., each row of sub-pixel region may form a four-domain mode, the pixel regions as previously discussed may form an eight-domain mode. The display panel controls one row of pixel regions by only one gate line to form the eight-domain mode, thus the design of the driving circuit is simple.

Figure 3:
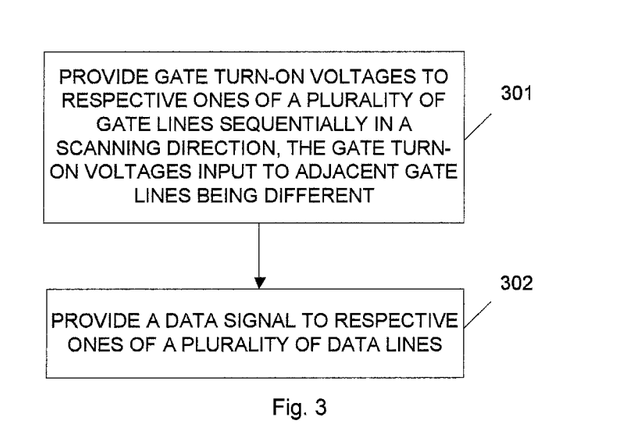
FIG. 3 is a flow chart of a display panel driving method provided according to an embodiment of the present disclosure.

FIG. 3 is a flow chart of a display panel driving method provided according to an embodiment of the present disclosure. With reference to FIG. 3, the method comprises:

Step 301 of providing gate turn-on voltages to respective ones of a plurality of gate lines sequentially in a scanning direction, the gate turn-on voltages provided to adjacent gate lines being different; and Step 302 of providing a data signal to respective ones of a plurality of data lines.

In the embodiment of the present disclosure, each pixel region is divided into two sub-pixel regions which are distributed in the scanning direction, one gate line drives the thin film transistors in two rows of sub-pixel regions in one row of pixel regions simultaneously, and one data line supplies a data signal to the thin film transistors in two sub-pixel regions of the same pixel region, so that the liquid crystal deflection voltages of two sub-pixel regions of the same pixel region are identical, but the liquid crystal deflection voltages of two adjacent rows of pixel regions are different since the gate turn-on voltages of the two adjacent rows of pixel regions are different. At this time, assuming that two adjacent rows of sub-pixel regions in four rows of sub-pixel regions in two rows are regarded as one row of pixel regions, the liquid crystal deflection voltages of two rows of sub-pixel regions in such row of pixel regions are different. Since two rows of sub-pixel regions of such row of pixel regions are respectively provided with liquid crystals having four initial pretilt angles, i.e., each row of sub-pixel region may form a four-domain mode, the pixel regions as previously discussed may form an eight-domain mode. The display panel controls one row of pixel regions by only one gate line to form the eight-domain mode, thus the design of the driving circuit is simple.

In an implementation, providing the gate turn-on voltages to respective ones of the plurality of gate lines sequentially in the scanning direction may comprise:

providing a first gate turn-on voltage to the gate lines connected to odd-numbered rows of pixel regions, and providing a second gate turn-on voltage to the gate lines connected to even-numbered rows of pixel regions. Using two voltages for alternately driving respective rows of pixel regions leads to a simple driving signal design.

In an implementation of the embodiment of the present disclosure, the difference between the first gate turn-on voltage and the second gate turn-on voltage is in a preset range. A too large difference between the first gate turn-on voltage and the second gate turn-on voltage may affect normal display, while a too small difference between the first gate turn-on voltage and the second gate turn-on voltage cannot form the eight-domain mode.

In another implementation of the embodiment of the present disclosure, when the first gate turn-on voltage and the second gate turn-on voltage are provided to the plurality of gate lines respectively, a charging rate of pixel electrodes in each of the first sub-pixel regions and each of the second sub-pixel regions is greater than a preset value, the pixel electrode being connected to a second electrode of the thin film transistor, the second electrode being an electrode in the source and the drain other than the first electrode. By controlling the two turn-on voltages to ensure that the charging rate satisfies the requirement, the display panel may display normally.

In the display panel in the eight-domain mode, the preset value is generally specified as 98.5%. In other words, in order to satisfy the requirement on the pixel charging rate, the charging rate should be greater than 98.5%.

The foregoing is merely of the preferred embodiments of the present disclosure and is not to be construed as limiting the present disclosure. Any modifications, equivalent substitutions, improvements and the like made within the spirit and principles of the present disclosure should be included within the scope of the present disclosure.

I claim:

1. A display panel, comprising: a first substrate and a second substrate arranged opposite to each other, and liquid crystals disposed between the first substrate and the second substrate, the first substrate comprising a plurality of gate lines and a plurality of data lines, wherein the first substrate is provided with a plurality of pixel regions distributed in an array, each of the plurality of pixel regions being provided with liquid crystals having four initial pretilt angles and comprising a first sub-pixel region and a second sub-pixel region arranged in a scanning direction, and each of the first sub-pixel region and the second sub-pixel region being provided with one thin film transistor;

each of the plurality of gate lines is connected to gates of all the thin film transistors in a row of pixel regions, each of the plurality of data lines being connected to first electrodes of all the thin film transistors in a column of pixel regions, and the first electrode being one of a source and a drain; and the display panel further comprises a driving circuit for providing different gate turn-on voltages to two adjacent gate lines.

2. The display panel according to claim 1, wherein the driving circuit is operative to provide a first gate turn-on voltage to the gate lines connected to odd-numbered rows of pixel regions, and to provide a second gate turn-on voltage to the gate lines connected to even-numbered rows of pixel regions.

3. The display panel according to claim 2, wherein a difference between the first gate turn-on voltage and the second gate turn-on voltage is in a preset range.

4. The display panel according to claim 3, wherein the gate line is arranged between the first sub-pixel region and the second sub-pixel region.

5. The display panel according to claim 2, wherein when the first gate turn-on voltage and the second gate turn-on voltage are provided to the plurality of gate lines respectively, a charging rate of pixel electrodes in each of the first sub-pixel regions and each of the second sub-pixel regions is greater than a preset value, the pixel electrode being connected to a second electrode of the thin film transistor, and the second electrode being an electrode in the source and the drain other than the first electrode.

6. The display panel according to claim 5, wherein the gate line is arranged between the first sub-pixel region and the second sub-pixel region.

7. The display panel according to claim 5, wherein the preset value is 98.5%.

8. The display panel according to claim 7, wherein the gate line is arranged between the first sub-pixel region and the second sub-pixel region.

9. The display panel according to claim 2, wherein the gate line is arranged between the first sub-pixel region and the second sub-pixel region.

10. The display panel according to claim 1, wherein the gate line is arranged between the first sub-pixel region and the second sub-pixel region.

11. A display device, comprising the display panel according to claim 1.

12. The display device according to claim 11, wherein the driving circuit is operative to provide a first gate turn-on voltage to the gate lines connected to the odd-numbered rows of pixel regions, and to provide a second gate turn-on voltage to the gate lines connected to even-numbered rows of pixel regions.

13. The display device according to claim 12, wherein a difference between the first gate turn-on voltage and the second gate turn-on voltage is in a preset range.

14. The display device according to claim 12, wherein when the first gate turn-on voltage and the second gate turn-on voltage are provided to the plurality of gate lines respectively, a charging rate of pixel electrodes in each of the first sub-pixel regions and each of the second sub-pixel regions is greater than a preset value, the pixel electrode being connected to a second electrode of the thin film transistor, and the second electrode being an electrode in the source and the drain other than the first electrode.

15. The display device according to claim 11, wherein the gate line is arranged between the first sub-pixel region and the second sub-pixel region.

16. A method of driving a display panel according to claim 1, comprising:
providing gate turn-on voltages to respective ones of the plurality of gate lines sequentially in a scanning direction, the gate turn-on voltages provided to adjacent gate lines being different; and
providing a data signal to respective ones of the plurality of data lines.

17. The method according to claim 16, wherein providing the gate turn-on voltages to respective ones of the plurality of gate lines sequentially in the scanning direction comprises:
providing a first gate turn-on voltage to the gate lines connected to odd-numbered rows of pixel regions, and providing a second gate turn-on voltage to the gate lines connected to even-numbered rows of pixel regions.

18. The method according to claim 17, wherein a difference between the first gate turn-on voltage and the second gate turn-on voltage is in a preset range.

19. The method according to claim 17, wherein when the first gate turn-on voltage and the second gate turn-on voltage are provided to the plurality of gate lines respectively, a charging rate of pixel electrodes in each of the first sub-pixel regions and each of the second sub-pixel regions is greater than a preset value, the pixel electrode being connected to a second electrode of the thin film transistor, and the second electrode being an electrode in the source and the drain other than the first electrode.

20. The method according to claim 17, wherein the preset value is 98.5%.

* * * * *